United States Patent
Kyung et al.

(10) Patent No.: US 11,527,503 B2
(45) Date of Patent: Dec. 13, 2022

(54) METHOD FOR MANUFACTURING SEMICONDUCTOR PACKAGE

(71) Applicant: LG CHEM, LTD., Seoul (KR)

(72) Inventors: You Jin Kyung, Daejeon (KR); Minsu Jeong, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/972,528

(22) PCT Filed: Jan. 23, 2020

(86) PCT No.: PCT/KR2020/001154
§ 371 (c)(1),
(2) Date: Dec. 4, 2020

(87) PCT Pub. No.: WO2020/159158
PCT Pub. Date: Aug. 6, 2020

(65) Prior Publication Data
US 2021/0313290 A1     Oct. 7, 2021

(30) Foreign Application Priority Data

Jan. 29, 2019  (KR) .................. 10-2019-0011317
Jan. 22, 2020  (KR) .................. 10-2020-0008888

(51) Int. Cl.
*H01L 21/30*  (2006.01)
*H01L 23/00*  (2006.01)

(52) U.S. Cl.
CPC .............. *H01L 24/11* (2013.01); *H01L 24/81* (2013.01); *H01L 2224/81203* (2013.01)

(58) Field of Classification Search
None
See application file for complete search history.

(56) References Cited

U.S. PATENT DOCUMENTS 9,953,945 B2   4/2018 Kim et al.
2007/0141330 A1  6/2007 Morishima et al.
(Continued)

FOREIGN PATENT DOCUMENTS

EP   2940094 A1   11/2015
JP   2000-164633 A   6/2000
(Continued)

OTHER PUBLICATIONS

JP2012-238704—Machine English Translation (Year: 2012).*
(Continued)

*Primary Examiner* — Hung K Vu
(74) *Attorney, Agent, or Firm* — Rothwell, Figg, Ernst & Manbeck, P.C.

(57) ABSTRACT

The present disclosure relates to a method for manufacturing a semiconductor package including vacuum-laminating a non-conductive film on a substrate on which a plurality of through silicon vias are provided and bump electrodes are formed, and then performing UV irradiation, wherein an increase in melt viscosity before and after UV irradiation can be adjusted to 30% or less, whereby a bonding can be performed without voids during thermo-compression bonding, and resin-insertion phenomenon between solders can be prevented, fillets can be minimized and reliability can be improved.

10 Claims, 1 Drawing Sheet

(56) References Cited

U.S. PATENT DOCUMENTS

| | | |
|---|---|---|
| 2013/0157415 A1 | 6/2013 | Morita et al. |
| 2013/0264707 A1 | 10/2013 | Lee |
| 2015/0162290 A1 | 6/2015 | Lee |
| 2016/0075871 A1* | 3/2016 | Morita ............... H01L 24/81 |
| | | 525/481 |
| 2017/0186719 A1 | 6/2017 | Kira et al. |
| 2018/0240758 A1 | 8/2018 | Okamoto et al. |

FOREIGN PATENT DOCUMENTS

| | | |
|---|---|---|
| JP | 2002-083841 A | 3/2002 |
| JP | 2007-273768 A | 10/2007 |
| JP | 2010-037456 A | 2/2010 |
| JP | 2010-258240 A | 11/2010 |
| JP | 2012-238704 A | 12/2012 |
| JP | 2013-227435 A | 11/2013 |
| JP | 5476033 B2 | 4/2014 |
| JP | 2015-195199 A | 11/2015 |
| JP | 2017-120800 A | 7/2017 |
| KR | 10-2004-0030724 A | 4/2004 |
| KR | 10-2010-0097247 A | 9/2010 |
| KR | 10-2016-0058711 A | 5/2016 |
| KR | 10-1649055 B1 | 8/2016 |
| KR | 10-2018-0066174 A | 6/2018 |
| TW | 201334127 A | 8/2013 |

OTHER PUBLICATIONS

International Search Report dated May 7, 2020, issued in International Application No. PCT/KR2020/001154, 4 pages.

Brookfield Engineering Laboratories, Inc., Brookfield Dial Reading Viscometer with Electronic Drive Operating Instructions Manual No. M00-151-I0614, Sep. 17, 2015, 35 pages.

Schüller, et al., "Modelling rheological cone-plate test conditions" Annual Transactions of the Nordic Rheology Society, vol. 16, 2008, 6 pages.

Extended European Search Report dated Feb. 28, 2022 of the corresponding European Patent Application No. 20747640.9, 21 pages.

Song et al., "A comparative study of the effects of cone-plate and parallel-plate geometries on rheological properties under oscillatory shear flow", Korea-Australia Rheology Journal, Nov. 2017, vol. 29, No. 4, pp. 281-294.

TA instruments, "ARES-G2 Rheometer", Jun. 15, 2017, Retrieved from <http://www.tainstruments.com/wp-content/uploads/BROCH-ARES-G2-2017-EN.pdf>, PDF copy 38 pages.

* cited by examiner

[FIG. 1]
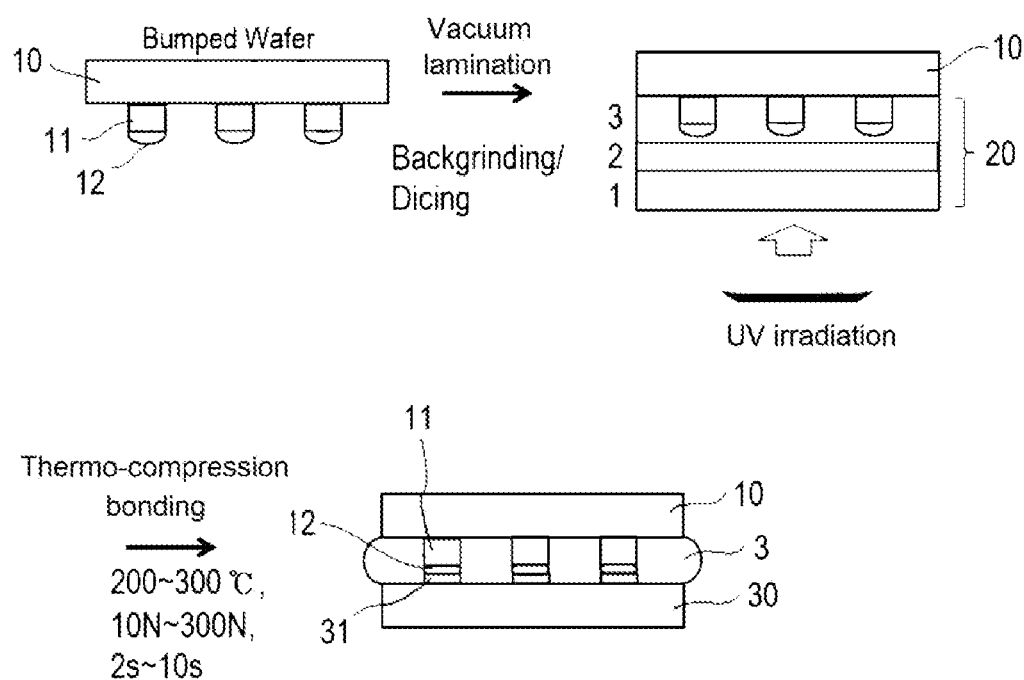
[FIG. 2]
| 4 | Protective film |
| 3 | Adhesive agent |
| 2 | Pressure-sensitive adhesive agent |
| 1 | Carrier Film |

METHOD FOR MANUFACTURING SEMICONDUCTOR PACKAGE

CROSS CITATION WITH RELATED APPLICATION(S)

This application is a 35 U.S.C. 371 National Phase Entry Application from PCT/KR2020/001154, filed on Jan. 23, 2020, designating the United States, which claims the benefit of priority based on Korean Patent Application No. 10-2019-0011317 filed on Jan. 29, 2019, and Korean Patent Application No. 10-2020-0008888 filed on Jan. 22, 2020 with the Korean Intellectual Property Office, the disclosures of which are incorporated herein by reference in their entirety.

The present disclosure relates to a method for manufacturing a semiconductor package with improved reliability.

TECHNICAL FIELD

Background of the Invention

Recently, as the tendency toward miniaturization, high functionalization, and capacity enlargement of electronic equipment has been expanding and the need for densification and high integration of the semiconductor package has rapidly increased, the size of semiconductor chips becoming larger and larger. In terms of improvement of integration degree, the stack package method for laminating chips in multi-stages has gradually increased.

In other words, according to a recent trend, flip chip type semiconductor devices in which a semiconductor element such as a semiconductor chip is mounted on a substrate by means of flip chip bonding have been widely utilized. In addition, in flip chip mounting, solder bumps and the like formed on a semiconductor element are melted and electrically connected to each other, and stack packages in which chips are laminated in multiple stages are increasing in order to increase the degree of integration.

Moreover, recently, a semiconductor using a through silicon via (TSV) has been developed, and signal transmission through a bump bonding process has been performed. Thermo-compression bonding technology (TCB) has been mainly applied for such bump bonding. At this time, the thermal curing property of the adhesive in the thermo-compression bonding technology affects the package manufacturing processability and the package reliability. For example, in 3D IC integrated technology, chips and chips are laminated by a flip chip bonding process, mainly using TSV (Through Silicon Via), having a fine pitch.

Further, as an adhesive for filling between TSV layers, a non-conductive paste (NCP) in the form of a paste has been developed, but there was a problem that as the pitch of the bumps becomes narrower and the thickness of the chip becomes thinner, it becomes difficult to adjust the thickness. In order to overcome this problem, a non-conductive film (NCF) implemented in the form of a film to increase connection reliability between semiconductor chips has been developed.

The thermo-compression bonding is performed in a short time of about 2 to 10 seconds while applying pressure at 200 to 300° C. However, in the adhesive agent cured by such abrupt temperature or pressure variations, voids are generated or resin-insertion phenomenon between solders are generated, which makes it difficult to secure reliability. Further, there is a problem that the package is contaminated due to excessive fillets from which the NCF resin is pressed out to the side during the thermo-compression.

BRIEF SUMMARY OF THE INVENTION

The present disclosure provides a method for manufacturing a semiconductor package which can perform bonding without voids, does not generate resin-insertion between solders, and has minimized fillets and improved reliability, during a thermo-compression bonding (TCB) for flip chip bonding process of a semiconductor device.

In one aspect, there is provided a method for manufacturing a semiconductor package including the steps of:
laminating a non-conductive film on a substrate having a plurality of through silicon vias; and
irradiating the substrate laminated by the non-conductive film with ultraviolet rays,
wherein the non-conductive film has a change rate in melt viscosity before and after UV irradiation of 1 to 30%.

Advantageous Effects

According to the present disclosure, by using a non-conductive film including an adhesive resin composition for a non-conductive film (NCF) as a sealing material of a semiconductor package, it is possible to manufacture a semiconductor package which can perform a flip chip bonding without voids during thermo-compression bonding, and does not generate resin-insertion between solders, thereby having a minimized fillet size while improving electrical connection reliability. In addition, the present disclosure can contribute to providing a semiconductor device capable of achieving signal transmission speed, low power, and high performance by using a through silicon via (TSV).

BRIEF DESCRIPTION OF THE DRAWINGS

FIG. 1 illustrates an exemplary embodiment of a method of packaging semiconductors according to the present disclosure.

FIG. 2 briefly illustrates the structure of a non-conductive film according to one embodiment of the present disclosure.

DETAILED DESCRIPTION OF THE EMBODIMENTS

Hereinafter, a method for manufacturing a semiconductor package according to specific embodiments of the present disclosure will be described in more detail. However, the following embodiments are for illustrative purposes only and are not intended to limit the scope of the present disclosure.

According to one embodiment of the present disclosure, there can be provided a method for manufacturing a semiconductor package including the steps of: laminating a non-conductive film on a substrate having a plurality of through silicon vias; and irradiating the substrate laminated by the non-conductive film with ultraviolet rays, wherein the non-conductive film has a change rate in melt viscosity before and after UV irradiation of 1 to 30%.

The present disclosure relates to a method for manufacturing a semiconductor package using a film-type sealing material at the time of bonding a TSV type semiconductor substrate on which bumps are formed, in a flip chip bonding process for manufacturing a semiconductor device. In particular, the present disclosure can prevent bumps from cracking by performing vacuum lamination using a non-conductive film instead of a paste type as a semiconductor sealing material.

Specifically, when laminating one or more semiconductor chips in the flip chip bonding process, an interlayer sealing filling material of the laminated chips can be used at the time of bonding between a substrate and a chip or between chips. At this time, according to one embodiment of the present disclosure, there can be provided a method for manufacturing a semiconductor package using a film-type non-conductive film (NCF) as an interlayer sealing material of the laminated chips, and using a vacuum lamination method in the application thereof.

Further, as the film-type sealing material, a non-conductive film including an adhesive layer having a change rate in melt viscosity after UV irradiation of 1 to 30%, or 5 to 29%, or 15 to 27% can be used. Due to the use of such a film, bonding can be performed without voids during thermo-compression bonding (TCB), and insertion of resins in solders are not generated, and fillets are minimized, thereby manufacturing a semiconductor package with improved reliability. When the change rate in melt viscosity is 30% or more, it may cause a defect in thermal conductivity and a defect in connection quality during thermo-compression bonding.

Further, vacuum lamination is performed at the time of interlayer sealing of the semiconductor chips laminated using the non-conductive film for sealing. Since vacuum lamination is performed at a relatively low temperature, it is possible to completely fill between fine pitch bumps only when the viscosity is low in this temperature range. The use of the non-conductive film can prevent breakage of bumps during vacuum lamination.

The step of irradiating the substrate laminated by the non-conductive film with ultraviolet rays may be performed at a light amount of 0.1 to 1000 $mJ/cm^2$. That is, the above step uses UV having a constant wavelength band and differs depending on the height of the bumps, the thickness of the non-conductive film, the thickness of the substrate film and the adhesive layer, but it is preferable to irradiate with ultraviolet light using a light amount of 0.1 to 1000 $mJ/cm^2$ or 100 to 1000 $mJ/cm^2$ or 300 to 800 $mJ/cm^2$. After exposure, photocuring may occur to form a crosslink between the photo-initiator and the ethylenically unsaturated functional groups included in the photo-curable resin, whereby the melt viscosity increases, and voids are not generated during the thermo-compression process due to partial crosslinking, and the fillets can be minimized.

Further, in the present disclosure, in addition to the configuration using the non-conductive film described above, a conventional packaging process can be performed.

For example, the packaging process includes: a wafer testing process during which defective semiconductor chips are inspected; a dicing process in which a wafer is cut into individual chips; a die bonding process wherein the separate chips are attached to a mounting board of a circuit film or lead frame; a wire bonding process wherein a chip pad provided on a semiconductor chip is connected with a circuit pattern of the circuit film or lead frame via electrical connecting means such as wire; and the like. At this time, before the dicing process, back grinding process for thinning a substrate (wafer) to a desired thickness may be performed.

Further, after the step of irradiating ultraviolet rays, the method may further include thermo-compression bonding a substrate in which the non-conductive film irradiated with ultraviolet rays is laminated, and a semiconductor substrate having a plurality of electrode pads which are located opposite to the substrate on which the non-conductive film is laminated.

Specifically, the semiconductor package may be effectively manufactured by performing a thermo-compression bonding process after UV irradiation. The thermo-compression bonding process is preferably performed within a short time by applying a constant pressure at a high temperature of 200° C. or higher. When the UV irradiation is completed, an adhesive force between the pressure sensitive adhesive layer (PSA-Adhesive) and the adhesive layer is reduced and so the PSA layer is easily peeled off.

Preferably, the thermo-compression bonding may be performed at a temperature of 200 to 300° C. for 2 to 10 seconds under a pressure condition of 10 N to 300 N. It is possible to perform main bonding after temporary bonding for 1 second to 10 seconds at a temperature of 50° C. to 150° C. More preferably, the pressure conditions may be 10N to 300N or 50N to 250N. In addition, the time for the thermo-compression bonding may be 2 seconds to 8 seconds.

If the temperature at the time of the thermo-compression bonding is 200° C. or less, there is a problem that the electrical connection between the bump and the pad is not made because it does not reach the melting point of the solder located on the bump. If the temperature is 300° C. or higher, there is a problem that the non-conductive film is thermally decomposed and outgas is generated.

Further, if the pressure during the thermo-compression bonding is 10N or less, there is a problem that connection between the bump and the pad is difficult. Further, if the pressure is 300N or more, there is a risk that the bump may be damaged or the chip may be broken.

Further, the method may further include removing an adhesive layer of the non-conductive film before performing the thermo-compression bonding. Since the present disclosure includes the adhesive layer partially photo-cured after UV irradiation, removal of the pressure-sensitive adhesive layer after UV irradiation becomes relatively easy.

In this thermo-compression bonding process, a partially cured adhesive film (i.e., a non-conductive film) is used, so that voids or resin-insertion are not generated, and fillets are minimized, thereby manufacturing a semiconductor package with improved reliability.

Meanwhile, the present disclosure is characterized in that a film type is used as a sealing material of a semiconductor device, but a non-conductive film capable of both photocuring and heat-curing is used. The non-conductive film used herein can be provided by using the adhesive composition used for an ordinary non-conductive film.

Specifically, the non-conductive film may use a structure including an adhesive layer exhibiting a film form by partially curing an adhesive resin composition containing a photo-curable resin by UV irradiation.

Such a non-conductive film may be an adhesive film including a release treated substrate film (i.e., carrier film), a pressure-sensitive adhesive layer, and an adhesive layer. Further, in the non-conductive film, a protective film is further included on the adhesive layer, and when used as a sealing material for a semiconductor package, the protective film can be removed and used.

Further, since the photo-curable resin and the photo-initiator in the adhesive resin composition are reacted by UV irradiation and the adhesive layer formed on the non-conductive film is partially cured, such film becomes harder and has a higher viscosity. Thereby, adhesive force between the adhesive layer and the pressure sensitive adhesive layer (PSA) are also reduced, and removal of the pressure-sensitive adhesive layer becomes easy.

The adhesive resin composition for forming the non-conductive film is not limited as long as the composition is such that the increase in melt viscosity during the photo-curing, i.e., the change rate, is within 1% to 30%, or 5% to 29%, or 15% to 27% or less compared to before irradiation with ultraviolet light.

According to a preferred embodiment, the adhesive layer in the non-conductive film of the present disclosure may include a resin composition including (a) a photo-curable resin having a photo-curable unsaturated functional group, (b) a thermo-curable resin and a curing agent, (c) a photo-initiator, (d) an inorganic filler, and (e) a catalyst.

Further, the non-conductive film may have a melt viscosity of 800 to 15000 Pa·s before being irradiated with ultraviolet rays and a melt viscosity of 1000 to 18000 Pa·s after being irradiated with ultraviolet rays.

If the melt viscosity of the non-conductive film before UV irradiation is 800 Pa·s or less, there is a problem that the film is difficult to handle due to stickiness. If the melt viscosity is 15000 Pa·s or more, there is a problem that the viscosity is high, gaps between bumps during vacuum lamination are not completely filled, and voids may be generated. Therefore, by using the adhesive resin composition for forming the non-conductive film in the present disclosure, the composition whose change rate before and after UV irradiation is 1 to 30% can be used without limitation, but it is important to be within the viscosity range.

Meanwhile, according to the present disclosure, vacuum lamination is performed when the non-conductive film is formed on a substrate including TSV.

Preferably, in the present disclosure, the step of laminating the non-conductive film is preferably performed at 40 to 130° C. or 40 to 100° C. under vacuum conditions. At this time, during the vacuum lamination, if the temperature is 40° C. or less, there is a problem that the fluidity of the film is low and thus the gaps between bumps are not be filled. If the temperature is 130° C. or higher, there is a problem in that thermal curing occurs during lamination and the melt viscosity increases, so that filling properties are not exhibited. That is, when a material for semiconductor sealing is vacuum-laminated on a bump substrate, the use of a non-conductive film allows the fine pitch bumps to be effectively buried at the lamination temperature.

Further, in the substrate having the plurality of through silicon vias, a plurality of through silicon vias penetrating the inside of the semiconductor substrate, and a plurality of bumps for connection are formed.

Specifically, the present disclosure uses a method of performing an electrical connection using a through silicon via (TSV) in order to achieve a signal transmission rate, a low power, and a high performance when manufacturing a semiconductor package.

The above method is a method of piercing a plurality of vias (holes) through the inside of a silicon chip used as a semiconductor substrate, filling the metal therein, and then performing connection between micro bumps. Therefore, a plurality of bumps can be formed on the semiconductor substrate, and the bumps may include a metal pillar and a solder cap on the pillar.

The solder cap is preferably formed to lower the bonding temperature, and it may be formed using Sn, SnAg, SnAgCu series which are a bonding layer.

Further, as will be described later, a semiconductor substrate having a metal pad may be arranged on an opposite surface of the substrate having the through silicon via.

According to the present disclosure, the semiconductor substrate including the TSV may be laminated one or more, and such a semiconductor substrate may be performed by a flip-chip packaging method. Further, the non-conductive film described above may be vacuum-laminated and used as a filling material at a center of the laminated chips.

For the TSV connection, the method can be performed according to a conventional method, and thus is not limited. For example, for the bump electrode, a micro bump bonding method which may include a metal pillar and a solder cap can be used. The metal filler is not particularly limited and may be, for example, a copper pillar well known.

The semiconductor packaging method according to the present disclosure will be described with reference to the accompanying figures.

FIG. 1 illustrates an exemplary embodiment of a method of packaging semiconductors according to the present disclosure.

FIG. 2 briefly illustrates the structure of a non-conductive film according to an exemplary embodiment of the present disclosure.

According to one embodiment of the present disclosure, a bumped wafer 10 including a plurality of through silicon vias penetrating the inside of the semiconductor substrate, and a plurality of bumps filling the through silicon via is prepared. A copper pillar 11 and a solder cap 12 whose main component is Sn is formed on the bumped wafer 10.

Thereafter, the non-conductive film 20 is located on the bumped wafer, vacuum lamination is performed, and thermo-compression bonding is performed.

At this time, the non-conductive film 20 includes a carrier film 1, a pressure-sensitive adhesive layer 2, an adhesive layer 3, and a protective film 4 as shown in FIG. 2. Such a non-conductive film may be applied by removing a protective film during vacuum lamination to a bumped wafer.

Further, after performing the vacuum lamination and before the UV irradiation, a conventional back grinding and a dicing step of cutting and individualizing the chip to a predetermined size can be performed.

Further, at the time of the thermo-compression bonding, after a wafer 10 on which the non-conductive film irradiated by ultraviolet rays is laminated, and a semiconductor substrate 30 having a plurality of electrode pads 31 which are disposed opposite to the substrate on which the non-conductive film 20 is laminated, are positioned, a step of thermo-compression bonding the two substrates may be performed.

Meanwhile, the photo-curable resin, the photo-initiator, the thermo-curable resin and the curing agent, the catalyst and the like contained in the resin composition for bonding semiconductors of the embodiment may be commonly applied to components known in the field of adhesive compositions for non-conductive films for connecting semiconductor circuits, and the type thereof is not limited.

For example, it is preferable that the photo-curable resin has a photo-curable ethylenically unsaturated functional group. As such a photo-curable resin, an acrylate-based compound can be preferably used, and more specific examples include one or more compounds selected from the group consisting of a hydroxyl group-containing acrylate-based compound such as 2-hydroxyethyl acrylate, 2-hydroxypropyl acrylate, pentaerythritol triacrylate, dipentaerythritol pentaacrylate, and the like; a water-soluble acrylate-based compound such as polyethylene glycol diacrylate, polypropylene glycol diacrylate, and the like; a polyfunctional polyesteracrylate-based compound of a polyhydric alcohol such as trimethylolpropane triacrylate, pentaerythritol tetraacrylate, dipentaerythritol hexaacrylate, and the like; an acrylate-based compound of an ethylene oxide adduct and/or a propylene oxide adduct of a polyfunctional alcohol such as trimethylol propane, hydrogenated bisphenol A, and the like, or a polyphenol such as bisphenol A, biphenol, and the like; a polyfunctional or monofunctional polyurethane acrylate-based compound which is an isocyanate adduct of the hydroxyl group-containing acrylate-based compound; an epoxyacrylate-based compound which is a (meth)acrylic acid adduct of bisphenol A diglycidylether, hydrogenated bisphenol A diglycidylether, or phenol novolac epoxy resin; a caprolactone-modified acrylate-based compound such as caprolactone-modified ditrimethylolpropane tetraacrylate, an acrylate of ε-caprolactone-modified di pentaerythritol, a caprolactone-modified hydroxyl pivalic acid neopentylglycolester diacrylate, and the like; and a photosensitive (meth)acrylate-based compound of a (meth)acrylate-based compound corresponding to the above-described acrylate-based compounds.

Further, from the viewpoint of improving reliability, a photo-curable resin having both a photo-curable unsaturated functional group and a reactive functional group (glycidyl group, acid anhydride group, hydroxy group, carboxy group, etc.) at the same time is more preferable. Examples of such photo-curable resins include, in addition to glycidyl (meth)acrylate and 4-hydroxybutyl (meth)acrylate glycidyl ether, a compound obtained by reacting a compound having a functional group and an ethylenically unsaturated group reacting with an epoxy group and a polyfunctional epoxy resin, a compound obtained by reacting phenol novolac-based resin with epichlorohydrin and 2-(meth)acryloyloxyethyl isocyanate, a polymerizable compound obtained by reacting a part of the copolymer of the compound having an unsaturated double bond such as styrene, α-methylstyrene, lower alkyl (meth)acrylate, and isobutylene, with a compound having an ethylenically unsaturated group such as vinyl group, allyl group, and (meth)acryloyl group and a reactive group such as epoxy group, for example, glycidyl (meth)acrylate, and then adding the ethylenically unsaturated group as a pendant group, and the like.

The photo-initiator plays a role of initiating the radical photo-curing between the photo-curable resins upon exposure of the resin composition.

As the photo-initiator, well-known compounds may be used, and benzoin and alkyl ethers thereof such as benzoin, benzoin methyl ether, benzoin ethyl ether, and the like; acetophenones such as acetophenone, 2,2-dimethoxy-2-phenyl acetophenone, 1,1-dichloro acetophenone, 4-(1-t-butyl-dioxy-1-methylethyl)acetophenone, and the like; anthraquinones such as 2-methyl anthraquinone, 2-amyl anthraquinone, 2-t-butyl anthraquinone, 1-chloro anthraquinone, and the like; thioxanthones such as 2,4-dimethyl thioxanthone, 2,4-diisopropyl thioxanthone, 2-chloro thioxanthone, and the like; ketals such as acetophenone dimethyl ketal, benzyldimethyl ketal, and the like; benzophenones such as benzophenone, 4-(1-t-butyldioxy-1-methylethyl)benzophenone, 3,3',4,4'-tetrakis(t-butyldioxycarbonyl)benzophenone, and the like may be used.

Furthermore, α-aminoacetophenones such as 2-methyl-1-[4-(methylthio)phenyl]-2-morpholinopropanone-1,2-benzyl-2-dimethylamino-1-(4-morpholinophenyl)-butane-1-on, 2-(dimethylamino)-2-[(4-methylphenyl)methyl]-1-[4-(4-morpholinyl)phenyl]-1-butanone, N,N-dimethylamino acetophenone (Irgacure (registered trade mark) 907, Irgacure (registered trade mark) 369, Irgacure (registered trade mark) 379, and the like of Chiba Specialty Chemical Co., Ltd. (present Chiba Japan Co., Ltd.) as commercially available products); and acylphosphine oxides such as 2,4,6-trimethylbenzoyl diphenyl phosphine oxide, bis(2,4,6-trimethylbenzoyl)-phenyl phosphine oxide, bis(2,6-diimethoxybenzoyl)-2,4,4-trimethyl-pentyl phosphine oxide (Lucirin (registered trade mark) TPO of BASF Co., Ltd., Irgacure (registered trade mark) 819 of Chiba Specialty Chemical Co., Ltd., and the like as commercially available products) may be mentioned as a preferable photo-initiator.

And, as other preferable photo-initiator, an oximeester compound may be mentioned. As specific examples of the oximeester compound, 2-(acetyloxyiminomethyl)thioxanthene-9-on, (1,2-octanedion, 1-[4-(phenylthio)phenyl]-, 2-(O-benzoyloxime)), (ethanone, 1-[9-ethyl-6-(2-methyl-benzoyl)-9H-carbazole-3-yl]-, 1-(O-acetyloxime)), and the like may be mentioned. As commercially available products, GGI-325, Irgacure OXE01, and Irgacure OXE02 of Chiba Specialty Chemicals Co., Ltd., N-1919 of ADEKA Co., Ltd., and Darocur TPO of Chiba Specialty Chemicals Co., Ltd. may be mentioned.

Examples of the thermo-curable resin is not particularly limited, but an epoxy resin can be preferably applied.

Specifically, the epoxy resin may be may be one or more selected from the group consisting of bisphenol-based epoxy resin, biphenyl-based epoxy resin, naphthalene-based epoxy resin, fluorene-based epoxy resin, phenol novolac-based epoxy resin, cresol novolac-based epoxy resin, bisphenol novolac-based epoxy resin, biphenyl novolac-based epoxy resin, trishydroxylphenylmethane-based epoxy resin, tetraphenylmethane-based epoxy resin, dicyclopentadiene-based epoxy resin, and dicyclopentadiene-modified phenol type epoxy resin and alicyclic epoxy resin.

Here, the bisphenol-based epoxy resin may include bisphenol A type epoxy resin, bisphenol F type epoxy resin, bisphenol S type epoxy resin, hydrogenated bisphenol A type epoxy resin, bisphenol AF type epoxy resin, and the like.

Further, the present adhesive composition may further include a thermoplastic resin. The type of the thermoplastic resin is also not particularly limited, and for example, it may include one or more polymer resins selected from the group consisting of polyimide, polyether imide, polyester imide, polyamide, polyether sulfone, polyether ketone, polyolefin, polyvinyl chloride, phenoxy, butadiene rubber, styrene-butadiene rubber, polyisoprene, reactive butadiene acrylonitrile copolymer rubber and (meth)acrylate-based resin.

Preferably, as the thermoplastic resin, a (meth)acrylate-based copolymer resin having a glass transition temperature of −10° C. to 30° C. and a weight average molecular weight of 50,000 to 1,000,000 g/mol may be used.

Meanwhile, the photo-curable resin may be included in an amount of 3 to 45 parts by weight based on 100 parts by weight of the total weight of the thermo-curable resin and the curing agent. If the content of the photo-curable resin is 3 parts by weight or less, there is a problem that photo-curing degree after UV irradiation is not sufficient and thus voids are generated. If the content is 45 parts by weight or more, there is a problem that the melt viscosity after UV irradiation is excessively increased, so that connection between bumps is not well performed during thermo-compression bonding.

The thermo-curable resin may be used in an amount of 15 to 80 parts by weight based on 100 parts by weight of solids content in the total resin composition.

The thermoplastic resin may be included in an amount of 10 to 500 parts by weight based on 100 parts by weight of the thermo-curable resin in consideration of control of the flowability of the composition during the production of the adhesive film.

As the curing agent, a compound known to be able to function as a curing agent for the thermo-curable resin can be used. More specifically, the curing agent may include one or more compounds selected from the group consisting of a phenol-based curing agent, an amine-based curing agent, and an acid anhydride-based curing agent.

As the curing agent, a novolac-based phenol resin can be preferably used.

The novolac-based phenol resin has a chemical structure in which a ring is located between reactive functional groups. Due to these structural properties, the novolac-based phenol resin can further lower the hygroscopicity of the adhesive composition, can further improve the stability in a high-temperature IR reflow process, and thus can play a role of preventing the peeling phenomenon or the reflow cracking of the adhesive film.

Specific examples of the novolac-based phenol resin include one or more selected from the group consisting of novolac phenol resin, xylok novolac phenol resin, cresol novolac phenol resin, biphenyl novolac phenol resin, bisphenol A novolac phenol resin, and bisphenol F novolac phenol resin.

As the novolac-based phenol resin, those having a softening point of 60° C. or higher, or 60° C. to 150° C., or 65° C. to 140° C. can be preferably used. The novolac-based phenol resin having a softening point of 60° C. or higher enables the adhesive composition to have sufficient heat resistance, strength, and adhesiveness after curing. However, if the softening point of the novolac-based phenol resin is too high, the fluidity of the adhesive composition is reduced, and voids are generated inside the adhesive in the actual semiconductor manufacturing process, so that the reliability or quality of the final product can be significantly reduced.

The content of the curing agent may be appropriately selected in consideration of physical properties and the like of the adhesive film finally manufactured. For example, the curing agent may be used in an amount of 10 to 700 parts by weight or 30 to 300 parts by weight based on 100 parts by weight of the thermo-curable resin.

The resin composition for bonding semiconductors may further include a curing catalyst.

The curing catalyst serves to promote the function of the curing agent or the curing of the adhesive resin composition for bonding semiconductors, and any conventional curing catalyst known in the art to be used in the manufacturing of the adhesive resin composition for bonding semiconductors or the like can be used without particular limitation.

For example, the curing catalyst used herein may include one or more selected from the group consisting of phosphorus-based compounds, boron-based compounds, phosphorus-boron-based compounds, and imidazole-based compounds. The used amount of the curing catalyst may be appropriately selected in consideration of the physical properties and the like of the adhesive film finally manufactured.

Meanwhile, the resin composition for bonding semiconductors of the embodiment may further include an inorganic filler.

As the inorganic filler, one or more inorganic particles selected from the group consisting of alumina, silica, barium sulfate, magnesium hydroxide, magnesium carbonate, magnesium silicate, magnesium oxide, calcium silicate, calcium carbonate, calcium oxide, aluminum hydroxide, aluminum nitride, and aluminum borate may be used.

An ion adsorbent capable of adsorbing ionic impurities and improving reliability can also be used as an inorganic filler. As the ion adsorbent, one or more inorganic particles selected from the group consisting of magnesium-based ion adsorbent such as magnesium hydroxide, magnesium carbonate, magnesium silicate, and magnesium oxide, a calcium-based ion adsorbent such as calcium silicate, calcium carbonate, and calcium oxide, an aluminum-based ion adsorbent such as alumina, aluminum hydroxide, aluminum nitride, and aluminum borate whiskers, a zirconium-based ion adsorbent, and antimony and bismuth-based ion adsorbents may be used.

As the inorganic filler, those having an average particle diameter (based on the longest outer diameter) of 0.01 to 10 µm, or 0.02 to 5.0 µm, or 0.03 to 2.0 µm can be preferably used. If the particle diameter of the inorganic filler is too small, it can be easily aggregated in the adhesive composition. Meanwhile, if the particle diameter of the inorganic filler is too large, it may cause damage to the semiconductor circuit and reduction in adhesiveness of the adhesive film due to the inorganic filler.

The content of the inorganic filler may be used in an amount of 10 to 300 parts by weight or 15 to 250 parts by weight based on total 100 parts by weight of the photo-curable resin, the thermo-curable resin, the curing agent, and the thermoplastic resin.

The resin composition for bonding semiconductors of the above embodiment may further include additives such as a flux, a leveling agent, an antifoaming agent and the like for removing the oxide film of the solder.

Further, the adhesive composition for connecting a semiconductor circuit may include 10 to 200 parts by weight of an organic solvent based on 100 parts by weight of the total weight of the photo-curable resin, the thermo-curable resin, the curing agent and the thermoplastic resin, and the inorganic filler. The content of the organic solvent may be determined in consideration of physical properties or a manufacturing process of the adhesive composition and the finally produced adhesive film.

The organic solvent may be one or more compounds selected from the group consisting of esters, ethers, ketones, aromatic hydrocarbons, and sulfoxides.

The ester-based solvent may be ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, gamma-butyrolactone, epsilon-caprolactone, delta-valerolactone, alkyl oxyacetate (e.g., methyl oxyacetate, ethyl oxyacetate, butyl oxyacetate (e.g., methyl methoxyacetate, ethyl methoxyacetate, butyl methoxyacetate, methyl ethoxyacetate, ethyl ethoxyacetate, etc.)), 3-oxypropionic acid alkyl esters (e.g., methyl 3-oxypropionate, ethyl 3-oxypropionate, etc. (e.g., methyl 3-methoxypropionate, ethyl 3-methoxypropionate, methyl 3-ethoxypropionate, ethyl 3-ethoxypropionate, etc.)), 2-oxypropionic acid alkyl esters (e.g., methyl 2-oxypropionate, ethyl 2-oxypropionate, propyl 2-oxypropionate, etc. (e.g., methyl 2-methoxypropionate, ethyl 2-methoxypropionate, propyl 2-methoxypropionate, 2-methyl ethoxypropionate, ethyl 2-ethoxypropionate)), methyl 2-oxy-2-methylpropionate and ethyl 2-oxy-2-methylpropionate (e.g., methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutanoate, ethyl 2-oxobutanoate, etc.

The ether solvent may be diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, or the like.

The ketone solvent may be methyl ethyl ketone, cyclohexanone, cyclopentanone, 2-heptanone, 3-heptanone, N-methyl-2-pyrrolidone, or the like.

The aromatic hydrocarbon solvent may be toluene, xylene, anisole, limonene, or the like.

The sulfoxide solvent may be dimethyl sulfoxide, or the like.

In addition, the adhesive composition for connecting a circuit may include a coupling agent. The type of the coupling agent is not particularly limited, but preferably, 2-(3,4-epoxycyclohexyl)-ethyltrimethoxysilane, 3-glycidoxypropyltrimethoxysilane, 3-glycidoxypropylmethyl-diethoxysilane, 3-glycidoxypropyltriethoxysilane, N-2(aminoethyl) 3-aminopropylmethyldimethoxysilane, N-2 (aminoethyl) 3-aminopropyltrimethoxysilane, N-2 (aminoethyl) 3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, mercapto-containing 3-mercaptopropylmethyldimethoxysilane, 3-mercaptopropyl trimethoxysilane, or the like can be used.

According to yet another embodiment of the present disclosure, in the non-conductive film containing the above-mentioned adhesive composition, the release-treated substrate film used here may include a resin film excellent in heat resistance and chemical resistance as a support substrate for supporting the film; a crosslinked film obtained by crosslinking the resin constituting the resin film; or a film obtained by coating a silicone resin or the like onto the surface of the resin film and subjecting it to a release treatment.

As the resin constituting the resin film, polyolefins such as polyester, polyethylene, polypropylene, polybutene, polybutadiene, and the like, vinyl chloride, ethylene-methacrylic acid copolymer, ethylene vinyl acetate copolymer, polyester, polyimide, polyethylene terephthalate, polyamide, polyurethane, etc. can be used. In view of UV irradiation, transparent polyethylene terephthalate is preferred.

The thickness of the support substrate is not particularly limited, but may be 3 to 400 µm, or 5 to 200 µm, or 10 to 150 µm.

The adhesive layer is made of the above-mentioned adhesive composition. The details of the adhesive composition are the same as described above.

Further, if necessary, a pressure-sensitive adhesive layer may be interposed on the adhesive layer. As the pressure-sensitive adhesive layer, those known in the art can be used without particular limitation.

The type of the protective film is not particularly limited, and plastic films known in the art can be used.

For example, the protective film may be polyester, polyethylene, polypropylene, polyethylene terephthalate, or the like.

The method of manufacturing the non-conductive film for sealing semiconductors is not limited, and the film can be obtained by methods well known in the art. As an example, the film may be manufactured by forming a pressure-sensitive adhesive layer on the support substrate and then sequentially laminating an adhesive layer and a protective film on the pressure-sensitive adhesive layer.

As the method of forming an adhesive layer on the support substrate, a method in which the adhesive composition is coated as it is or in a form diluted with an appropriate organic solvent onto the support substrate or the release film by known means such as a comma coater, a gravure coater, a die coater, and a reverse coater, and then dried at a temperature of 60° C. to 150° C. for 10 seconds to 30 minutes may be used.

The thickness of the adhesive layer can be appropriately adjusted in the range of 1 to 500 µm, 5 to 100 µm, or 5 to 50 µm.

Hereinafter, embodiments of the present disclosure will be described in more detail by way of examples. However, the following examples are merely illustrative of specific embodiments of the invention, and the scope of the present disclosure is not limited thereby.

Preparation Example: Preparation of Photo-Curable Resin

Preparation Example 1

Epichlorohydrin and 2-acryloyloxy ethyl isocyanate were reacted in a molar ratio of 1:9 with VH-4170 (DIC, bisphenol A novolac resin) together with a catalyst to prepare a compound capable of both photo-curing and heat-curing at the same time.

Example 1: Manufacture of Resin Composition for Bonding Semiconductors and Non-Conductive Film (Adhesive Film)

A semiconductor package was manufactured according to the process of FIG. 1. As the non-conductive film used in the semiconductor packaging process, a film having a partially cured adhesive layer having the structure of FIG. 2 was used as a sealing material.

(1) Production of Adhesive Composition for Connecting Semiconductor Circuits 40 g of phenol resin KH-6021 (manufactured by DIC, bisphenol A novolac resin) as an epoxy resin curing agent; 30 g of RE-310S (manufactured by Nippon Kayaku Co., Ltd., bisphenol A epoxy resin) as an epoxy resin; 35 g of YDCN-500-5P (manufactured by Kukdo Chemical, cresol novolac epoxy resin), 10 g of A-DCP (manufactured by Shin-Nakamura Chemical Co., Ltd., tricyclomethane dimethanol diacrylate) as a photocuring agent, 0.5 g of dipentaerythritol hexaacrylate, 1 g of Darocur TPO as a photoinitiator, 15 g of thermoplastic acrylate resin KG-3015 (Mw: 900,000, glass transition temperature: 10° C.); 1.5 g of catalyst (2-phenyl-4,5-dihydroxymethyl imidazole); 1 g of flux and 75 g of inorganic filler spherical silica (SC-2050, Admatechs) were mixed with methyl ethyl ketone to obtain an adhesive composition for connecting semiconductor circuits (solids concentration of 45 wt %).

(2) Manufacture of Adhesive Film

An adhesive resin composition containing a conventional acrylic resin was coated onto a polyethylene terephthalate film (thickness of 38 µm) using a comma coater, and then dried to form a pressure-sensitive adhesive layer with a thickness of about 20 µm. Thereafter, the above-mentioned adhesive resin composition was coated using the comma coater, and dried at 110° C. for 3 minutes to obtain an adhesive film having an adhesive layer with a thickness of about 20 µm. Subsequently, a normal protective film (release-treated polyethylene terephthalate) was formed on the adhesive layer to a thickness of about 20 µm.

(3) Manufacture of Semiconductor Device

A wafer including a bump chip (4.5 mm×4.5 mm), which is a semiconductor device in which a plurality of through silicon vias are provided and a lead-free solder (SnAgCu) was formed to a height of 3 μm on a copper filler with a height of 15 μm and a pitch of 50 μm, was prepared.

The protective film was removed from the non-conductive adhesive film, the adhesive layer of the adhesive film was located on the bump surface of the wafer, vacuum lamination was performed at 80° C., and then individualized into chip units.

The individualized bump chip on which the non-conductive film was vacuum-laminated was irradiated with ultra-violet light at a light amount of 500 mJ/cm$^2$.

When the UV irradiation was completed, the adhesive strength of the adhesive layer was reduced, so that the pressure-sensitive adhesive layer on the adhesive layer of the non-conductive film was easily removed together with the release substrate film.

Subsequently, the individualized bump chip on which the adhesive layer was laminated was temporarily bonded to a 6 mm×8 mm substrate chip having a connection pad with a pitch of 50 μm using a thermocompression bonder at 70° C. under 100 N for 3 seconds, and then heated to 260° C. and subjected to thermo-compression bonding for 4 seconds.

Example 2

An adhesive film and a semiconductor device were manufactured in the same manner as in Example 1, except for using the following adhesive composition.

50 g of phenol resin GPH-65 (manufactured by Nippon Kayaku Co., Ltd., bisphenol novolac resin) as an epoxy resin curing agent; 20 g of RE-310S (manufactured by Nippon Kayaku Co., Ltd., bisphenol A epoxy resin, epoxy equivalent weight of 180 g/eq) as an epoxy resin; 30 g of YDCN-500-5P (manufactured by Kukdo Chemical, cresol novolac epoxy resin), 15 g of the compound of Preparation Example 1 as a photo-curable resin, 0.3 g of OXE01 as photo-initiator; 1.5 g of catalyst (2-phenyl-4,5-dihydroxymethyl imidazole); 1 g of flux; and 90 g of inorganic filler spherical silica (SC-2050, Admatechs) were mixed with methyl ethyl ketone to obtain an adhesive composition for connecting semiconductor circuits (solids concentration of 45 wt %).

Example 3

An adhesive film and a semiconductor device were manufactured in the same manner as in Example 1, except for using the following adhesive composition.

An adhesive composition for connecting semiconductor circuits was obtained in the same manner as in Example 1, except that 15 g of KG-3015 was further added as a thermoplastic resin in Example 2.

Comparative Example 1

An adhesive film and a semiconductor device were manufactured in the same manner as in Example 1, except for using the following adhesive composition.

An adhesive composition for connecting semiconductor circuits was obtained in the same manner as in Example 1, except that in Example 1, the photocuring agent A-DCP (manufactured by Shin-Nakamura Co., Ltd., tricyclomethane dimethanol diacrylate) and dipentaerythritol hexaacrylate, and photo-initiator Darocur TPO were not added.

Comparative Example 2

A semiconductor device was manufactured in the same manner as in Example 3, except that in Example 3, a non-conductive adhesive film was laminated, and then subjected to thermo-compression bonding without performing UV irradiation.

Comparative Example 3

An adhesive film and a semiconductor device were manufactured in the same manner as in Example 1, except for using the following adhesive composition.

An adhesive composition for connecting semiconductor circuits was obtained in the same manner as in Example 2, except that in Example 2, GPH-65 was changed to 40 g of KA-1163 (manufactured by DIC, cresol novolac resin), RE-310S was changed to EOCN-104S, and inorganic filler SC-2050 (Admatechs, spherical silica, average particle diameter of 500 nm) was changed to 340 g of YC100C (Admatechs, spherical silica, average particle diameter of 100 nm).

Comparative Example 4

An adhesive film and a semiconductor device were manufactured in the same manner as in Example 1, except for using the following adhesive composition.

An adhesive composition was obtained in the same manner as in Example 2, except that in Example 2, 70 g of the compound of Preparation Example 1 as a photo-curable resin, 5 g of dipentaerythritol hexaacrylate, 0.8 g of OXE01 as a photo-initiator, 100 g of inorganic filler (SC-2050, Admatechs, spherical silica) were used.

Comparative Example 5

An adhesive film and a semiconductor device were manufactured in the same manner as in Example 1, except for using the following adhesive composition.

50 g of phenol resin VH-4170 (manufactured by DIC, bisphenol A novolac resin) as an epoxy resin curing agent; 75 g of RE-310S (manufactured by Nippon Kayaku Co., Ltd., bisphenol A epoxy resin, epoxy equivalent weight of 180 g/eq) as an epoxy resin; 10 g of A-BPE-10 (manufactured by Shin-Nakamura Chemical Co., Ltd., 2.2-bis[4-(acryloxypolyethoxy)phenyl]propane (ethylene oxide (10 mol) adduct)), 0.5 g of Darocur TPO as a photo-initiator, 1 g of catalyst (2-phenyl-4,5-dihydroxymethyl imidazole); 1 g of flux; and 40 g of inorganic filler spherical silica (SC-2050, Admatechs) were mixed with methyl ethyl ketone to obtain an adhesive composition for connecting semiconductor circuits.

Test Example (1) Measurement of Melt Viscosity and Viscosity Change Rate

The adhesive films respectively obtained in Examples and Comparative Examples were overlapped and laminated until the thickness became 320 μm, and then laminated using a roll laminator at 80° C. Subsequently, each specimen was molded into a circular shape having a diameter of 8 mm, and then applied to a heating rate of 10° C./min at a shear rate of 5 rad/s using TA Instruments advanced rheometric expansion system (ARES). The viscosity value of the lowest value of the measured value was judged as the melt viscosity. The melt viscosity after UV irradiation was measured by a process in which the carrier film side of the non-conductive adhesive film was irradiated with ultraviolet light of 500 mJ/cm$^2$ and then laminated to measure the melt viscosity in the same manner.

(2) Evaluation of Voids

The semiconductor device obtained in each of Examples and Comparative Examples was evaluated as either "acceptable" (○) if the area occupied by voids between a bump chip and a substrate chip was 1% or less through Scanning Acousitic Tomography (SAT), or as "unacceptable" (x) if the area exceeded 1%.

(3) Evaluation of Electrical Continuity

The semiconductor device obtained in each of Examples and Comparative Examples was evaluated as either "acceptable" (o) if daisy chain connection could be confirmed, or as "unacceptable" (x) if daisy chain connection could not be confirmed.

(4) Evaluation of Connection Quality

The connection part in the semiconductor device obtained in each of Examples and Comparative Examples was exposed by cross-sectional polishing, and observed using an optical microscope. An evaluation of "acceptable" (0) was assigned if no trapping was seen in the joint part and the solder had sufficiently wetted the wiring, while otherwise an evaluation of "unacceptable" (X) was assigned.

(5) Evaluation of Fillets (Unit: μm)

The semiconductor device obtained in each of Examples and Comparative Examples was observed on a bump chip using an optical microscope, and the maximum length of the fillet through which the non-conductive adhesive film flowed out was measured.

TABLE 1

|  | Example 1 | Example 2 | Example 3 |
|---|---|---|---|
| melt viscosity (Pa · s) | 3500 | 4300 | 5700 |
| Melt viscosity after UV irradiation (Pa · s) | 4100 | 5400 | 6800 |
| Melt viscosity change rate(%) | 17 | 26 | 19 |
| Evaluation of voids | ○ | ○ | ○ |
| Evaluation of electrical continuity | ○ | ○ | ○ |
| Connection quality | ○ | ○ | ○ |
| Fillet size (μm) | 280 | 250 | 210 |

TABLE 2

|  | Comparative Example 1 | Comparative Example 2 | Comparative Example 3 | Comparative Example 4 | Comparative Example 5 |
|---|---|---|---|---|---|
| Melt viscosity (Pa · s) | 4100 | 5700 | 19500 | 4200 | 200 |
| Melt viscosity after UV irradiation (Pa · s) | 4100 | 5700 | 26100 | 23200 | 750 |
| Melt viscosity change rate(%) | 0 | 0 | 34 | 552 | 375 |
| Evaluation of voids | x | x | ○ | ○ | x |
| Evaluation of electrical continuity | ○ | ○ | x | x | ○ |
| Connection quality | x | x | x | x | x |
| Fillet size (μm) | 650 | 570 | 280 | 230 | 900 |

Looking at the results of Tables 1 and 2, it could be confirmed that in Examples 1 to 3, the rate of change in melt viscosity before and after UV irradiation was low to 30% or less, so that voids were not generated during thermo-compression bonding, and the electrical continuity and connection quality were excellent. In addition, the fillets of Examples 1 to 3 could also be reduced, thereby improving reliability.

On the other hand, Comparative Examples 1 to 2 did not have a change in melt viscosity before and after UV irradiation, and showed good electrical continuity evaluation results, but voids were generated, the connection quality was poor, and the fillets were excessive, which acted as a cause of contaminating the package.

In addition, in Comparative Example 3, as the inorganic filler was excessively used, the melt viscosity of the film increased, and the rate of change in the melt viscosity became 30% or more, and no bump connection was performed even after TCB, so that electrical continuity was not performed and a defect in connection quality occurred.

Further, in Comparative Example 4, since the content range of the photo-curable resin was excessive, the rate of change in melt viscosity before and after UV irradiation increased to 552%, indicating defective electrical continuity and defective connection quality. That is, in Comparative Example 4, the content of the photo-curable resin was increased, and thus, after irradiation with the same amount of UV, the viscosity was significantly increased, so that the connection during TCB was not performed properly.

Further, in Comparative Example 5, it was confirmed that the melt viscosity before and after UV irradiation was low, and macro voids were generated during TCB, and trapping of the adhesive occurred between the solders of the joint parts.

Therefore, as in the present disclosure, when a non-conductive film that is not a paste type is used as a semiconductor sealing material, in particular, a vacuum lamination is performed using a non-conductive film in which the change rate in melt viscosity before and after UV irradiation is adjusted, fillets can be minimized and breakage of bumps can be prevented. Thus, according to the method for manufacturing a semiconductor package of the present disclosure, it is possible to improve reliability due to excellent electrical continuity and connection quality during thermo-compression bonding.

The invention claimed is:

1. A method for manufacturing a semiconductor package comprising the steps of:
   laminating a non-conductive film on a substrate having a plurality of through silicon vias; and
   irradiating the substrate laminated by the non-conductive film with ultraviolet rays,
   wherein the non-conductive film has a change rate in melt viscosity before and after UV irradiation of 1 to 30%,
   wherein the non-conductive film has a melt viscosity of 800 to 15000 Pa·s before being irradiated with ultraviolet rays and a melt viscosity of 1000 to 18000 Pa·s after being irradiated with the ultraviolet rays, and
   wherein the step of laminating the non-conductive film is performed at 40 to 130° C. under vacuum conditions.

2. The method for manufacturing a semiconductor package of claim 1, wherein the change rate in melt viscosity of the non-conductive film is 15 to 27% before and after UV irradiation.

3. The method for manufacturing a semiconductor package of claim 1, wherein the step of irradiating the substrate laminated by the non-conductive film with ultraviolet rays is performed at a light amount of 0.1 to 1000 mJ/cm$^2$.

4. The method for manufacturing a semiconductor package of claim 1, wherein the non-conductive film includes a release-treated substrate film, a pressure-sensitive adhesive layer and an additional adhesive layer different from the pressure-sensitive adhesive layer.

5. The method for manufacturing a semiconductor package of claim 4, wherein the adhesive layer in the non-conductive film includes a resin composition including (a) a photo-curable resin having a photo-curable unsaturated functional group, (b) a thermo-curable resin and a curing agent, (c) a photo-initiator, (d) an inorganic filler, and (e) a catalyst.

6. The method for manufacturing a semiconductor package of claim 5, wherein the photo-curable resin is included in an amount of 3 to 45 parts by weight based on 100 parts by weight of the total weight of the thermo-curable resin and the curing agent.

7. The method for manufacturing a semiconductor package of claim 1, wherein bumps are formed by the plurality of through silicon vias penetrating the non-conductive film laminated on the substrate.

8. The method for manufacturing a semiconductor package of claim 1, wherein after the step of irradiating ultraviolet rays, the method further includes thermo-compression bonding the substrate on which the laminated non-conductive film is irradiated with ultraviolet rays, and a semiconductor substrate having a plurality of electrode pads facing the substrate on which the non-conductive film is laminated.

9. The method for manufacturing a semiconductor package of claim 8, wherein the thermo-compression bonding is performed at a temperature of 200 to 300° C. for 2 to 10 seconds under a pressure condition of 10 N to 300 N.

10. The method for manufacturing a semiconductor package of claim 8, further including removing a pressure-sensitive adhesive layer of the non-conductive film before performing the thermo-compression bonding.

* * * * *